US008675366B2

(12) United States Patent
Yu et al.

(10) Patent No.: US 8,675,366 B2
(45) Date of Patent: Mar. 18, 2014

(54) CASCADE DATA STORAGE DEVICE

(75) Inventors: Hong-Chi Yu, Kaohsiung (TW);
Mao-Ting Chang, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 365 days.

(21) Appl. No.: 13/067,234

(22) Filed: May 18, 2011

(65) Prior Publication Data

US 2012/0258610 A1    Oct. 11, 2012

(30) Foreign Application Priority Data

Apr. 6, 2011 (TW) .............................. 100111775 A

(51) Int. Cl.
*H05K 7/00* (2006.01)
(52) U.S. Cl.
USPC ........................................ 361/729; 361/755
(58) Field of Classification Search
USPC ................. 361/755, 728–730, 752, 796, 800; 439/74, 78, 81, 83, 347, 660
See application file for complete search history.

(56) References Cited

U.S. PATENT DOCUMENTS

| 6,519,812 | B2* | 2/2003 | Ko et al. ........................ 16/354 |
| 7,184,264 | B2* | 2/2007 | Le .............................. 361/679.32 |
| 7,447,037 | B2* | 11/2008 | Hiew et al. ................... 361/737 |
| 7,710,736 | B2* | 5/2010 | Middlekauff et al. ........ 361/737 |
| 8,032,988 | B2* | 10/2011 | Lai et al. ........................ 16/354 |
| 8,414,335 | B2* | 4/2013 | Yu et al. ...................... 439/660 |
| 2012/0026672 | A1* | 2/2012 | Yu et al. ................... 361/679.32 |

* cited by examiner

*Primary Examiner* — Hung S Bui
(74) *Attorney, Agent, or Firm* — Bacon & Thomas, PLLC

(57) ABSTRACT

The present invention is to provide a cascade data storage device comprising at least an integrated circuit module and a connecting structure wherein the integrated circuit module has a substrate, at least an electronic device, a package body and a USB metal contact and the connecting structure has at least a male connector and at least a female connector; the connecting structure is installed on a lateral edge of the package body and allows the male connector to couple with the female connector and then the integrated circuit modules freely connected, which are stacked high enough and keep the USB metal contact electrically contact with a USB port of a computer.

9 Claims, 8 Drawing Sheets

CASCADE DATA STORAGE DEVICE

BACKGROUND OF THE INVENTION

1) Field of the Invention

The present invention relates to a data storage device, especially to a cascade data storage device which enables at least an integrated circuit module (10) to be freely connected by means of a connecting structure.

2) Description of the Prior Art

The Internet era has facilitated information sharing accelerated as well as popularization and progress of information technology. In this regard, a variety of products such as computers and communications & consumer electronics have extensively permeated into consumers' lives.

Recently, the portable data storage device with a data transfer interface and one type of non-volatile memory (for instance, flash memory) integrated has been substantially popularized. On the other hand, a portable device with the USB (Universal Serial Bus) data transfer interface combined which features some advantages such as lightness, portability, and plug-and-play attracts the public's interests.

Accordingly, there are more and more electronic products with USB data transfer interfaces integrated for diversified functions and applications available in the market. These electronic products include but are not limited to USB digital key for vehicles, USB privacy device for protection of digital data (privacy flash disk or electronic device with USB ports), USB automatic homepage guidance device for broadcasting or marketing, USB device with application programs automatically executed, and USB log-in device for public/private websites automatically registered or USB anti-burglar device for electronic devices with USB ports.

However, these mono-functional USB devices hereinabove are not easily stored or even lost or forgotten by one user. Particularly, these function-distinct USB devices have resulted in a user's confused memory or mistaken mix-up due to unclear identification markings corresponding to their functions. These inconveniences hereinbefore unfavorable to a user usually cause unnecessary perplexity.

Additionally, these USB devices limited to specifications for the height of a standard USB male connector have their volumes not further shrunk. In addition to those issues previously mentioned, these increasingly popular USB devices indeed occupy much space owing to restrictions in their own volumes and different USB devices with respective external shapes or sizes.

SUMMARY OF THE INVENTION

In order to solve the said issues, the present invention provides a cascade data storage device comprising at least an integrated circuit module and a connecting structure wherein the integrated circuit module has a substrate, at least an electronic device, a package body, and a USB metal contact and the connecting structure has at least a male connector and at least a female connector; the connecting structure installed on a lateral edge of a package body allows a male connector to couple with a female connector and then the freely connected integrated circuit module which are stacked high enough and keep the USB metal contact electrically contact with a computer's USB port.

Accordingly, the principal object of the present invention is to cascade the integrated circuit modules by means of a connecting structure and deliver the present invention well stored by a user.

The other object of the present invention is to cascade the integrated circuit modules which are stacked high enough and keep the USB metal contact electrically contact with a computer's USB port via a connecting structure, delivering the present invention's identical external under the integrated design principle, allowing the USB metal contact to electrically contact with a computer's USB port, and saving space occupied by the present invention.

The further object of the present invention is to use a connecting structure to cascade the integrated circuit modules for the present invention not lost or forgotten by one user.

The yet other object of the present invention is to employ a connecting structure to cascade the integrated circuit modules for the present invention having clear identification markings designated among integrated circuit modules without mistaken mix-up under the integrated design principle.

The yet still other object of the present invention is to employ a connecting structure to cascade the integrated circuit modules for multiple functions integrated in the present invention and a user's convenience.

To deliver the purposes hereinbefore, the principal technical measures for the present invention are delivered with the technical schemes as follows. The present invention of a cascade data storage device comprises at least an integrated circuit module and a connecting structure wherein the integrated circuit module has a substrate, at least an electronic device, a package body and a USB metal contact, the substrate comprises an inner surface and an outer surface, and the electronic device installed on the inner surface is electrically connected to the USB metal contact placed on the outer surface; the package body is encased in the electronic device; the connecting structure comprises at least a male connector and at least a female connector; characteristics shown as follows: the connecting structure installed on the package body's lateral edge allows the male connector to couple with the female connector and then the freely connected integrated circuit modules which are stacked high enough and keep the USB metal contact electrically contact with a computer's USB port.

The objects and the technical issues with respect to the present invention are further delivered with the following technical measures.

In the said cascade data storage device, the electronic device comprises at least a memory unit and a control unit.

In the said cascade data storage device, the USB metal contact complies with either at least one type of specification between the USB 2.0 Series A male connector and the USB 3.0 Series A male connector or a combination of these two specifications for data transfer interfaces thereof.

In the said cascade data storage device, the integrated circuit modules which are stacked high enough have a height equal to or less than the height of a USB male connector.

In the said cascade data storage device, either the male connector or the female connector is installed on the package body.

In the said cascade data storage device, either the male connector or the female connector and the package body are integrated to become a one-piece structure.

In the said cascade data storage device, the male connector with the female connector coupled allows the integrated circuit modules to become a cascade structure or a ring structure.

In the said cascade data storage device, the connecting structure is installed inside two recesses at two ends of the package body's lateral edge.

In the said cascade data storage device, the connecting structure is installed inside one recess of the package body's lateral edge.

In contrast to the prior arts, the present invention, which employs a connecting structure to cascade integrated circuit modules with distinct functions configured within, delivers multiple functions integrated in the present invention for convenience of one user such as well storage, less space occupied, user's less loss or forgetting to carry, and no mistaken mix-up between integrated circuit modules.

BRIEF DESCRIPTIONS OF THE DRAWINGS

Figure 5A:
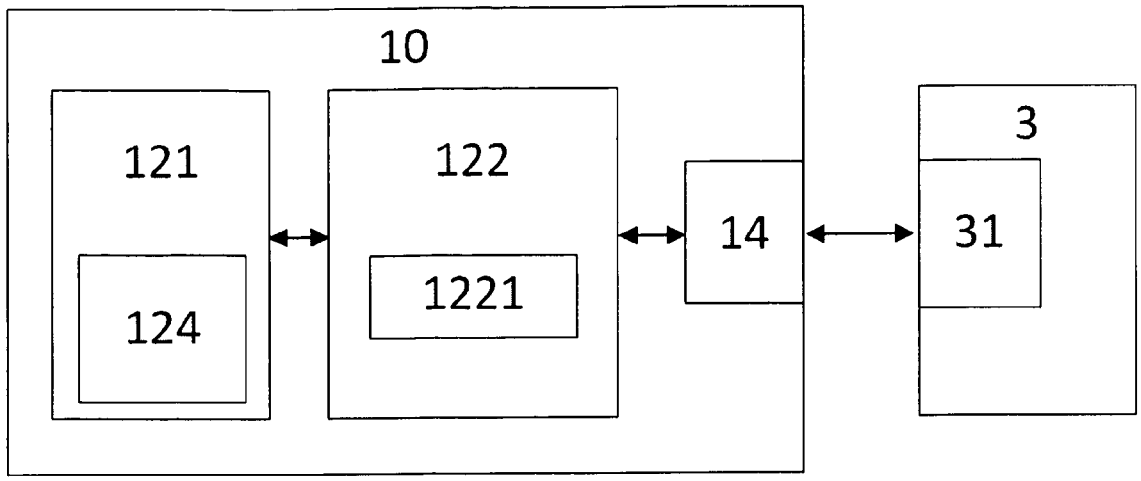
FIG. 5a is the first block diagram of the first embodiment for the present invention of a cascade data storage device.
Figure 5B:
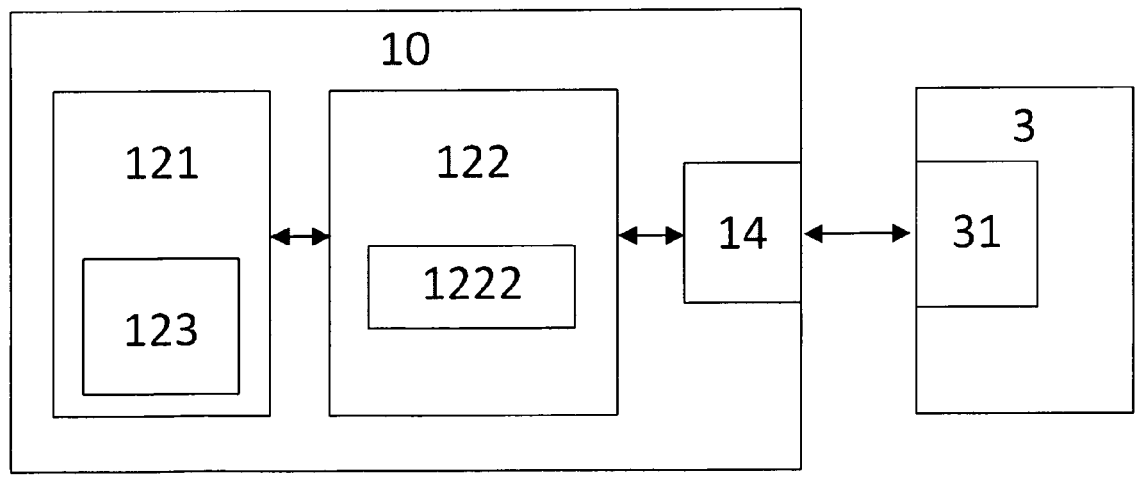

FIG. 5b the second block diagram of the first embodiment for the present invention of a cascade data storage device.

Figure 6:
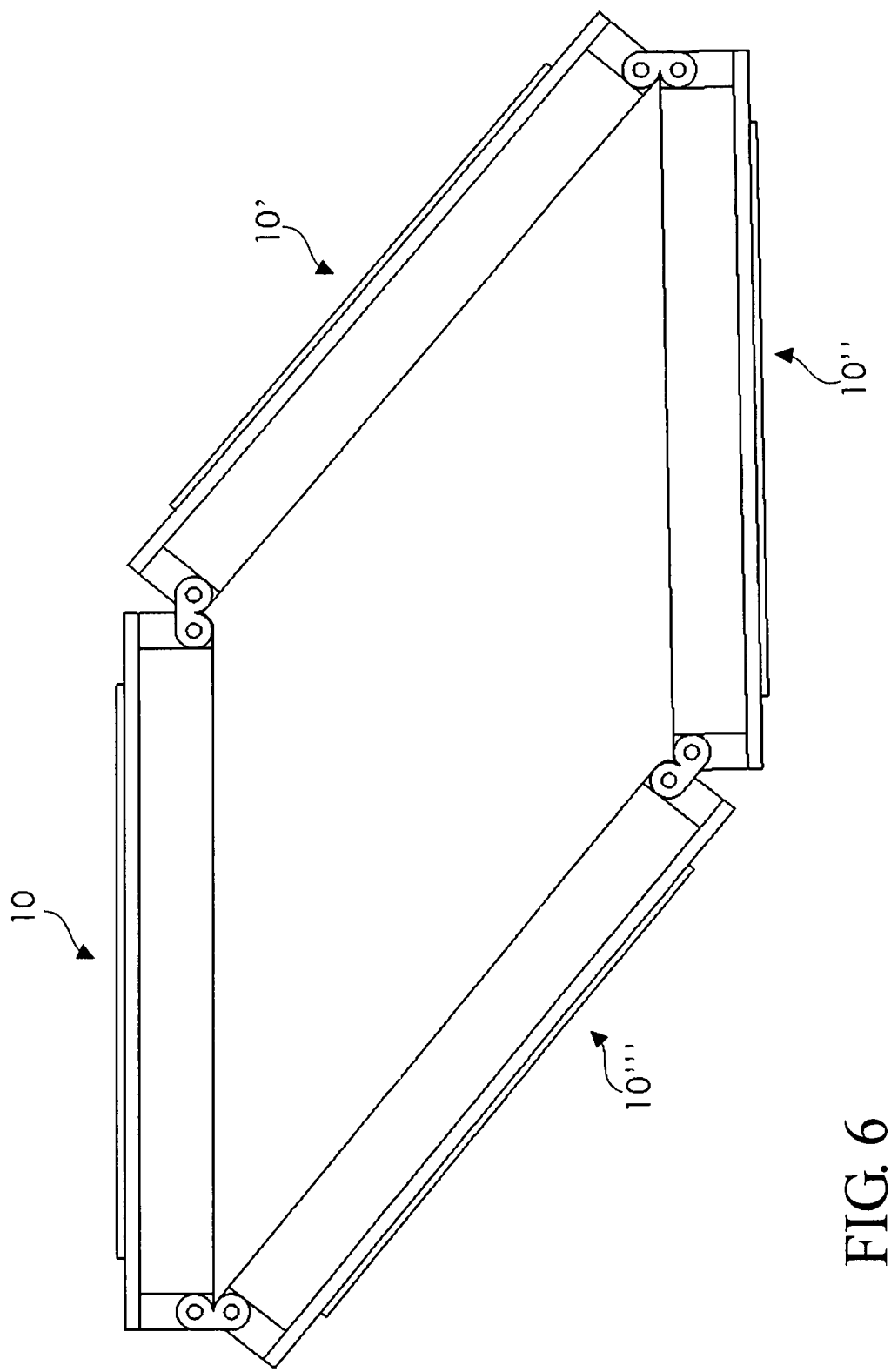

FIG. 6 is the perspective view of the second embodiment for the present invention of a cascade data storage device.

Figure 7A:
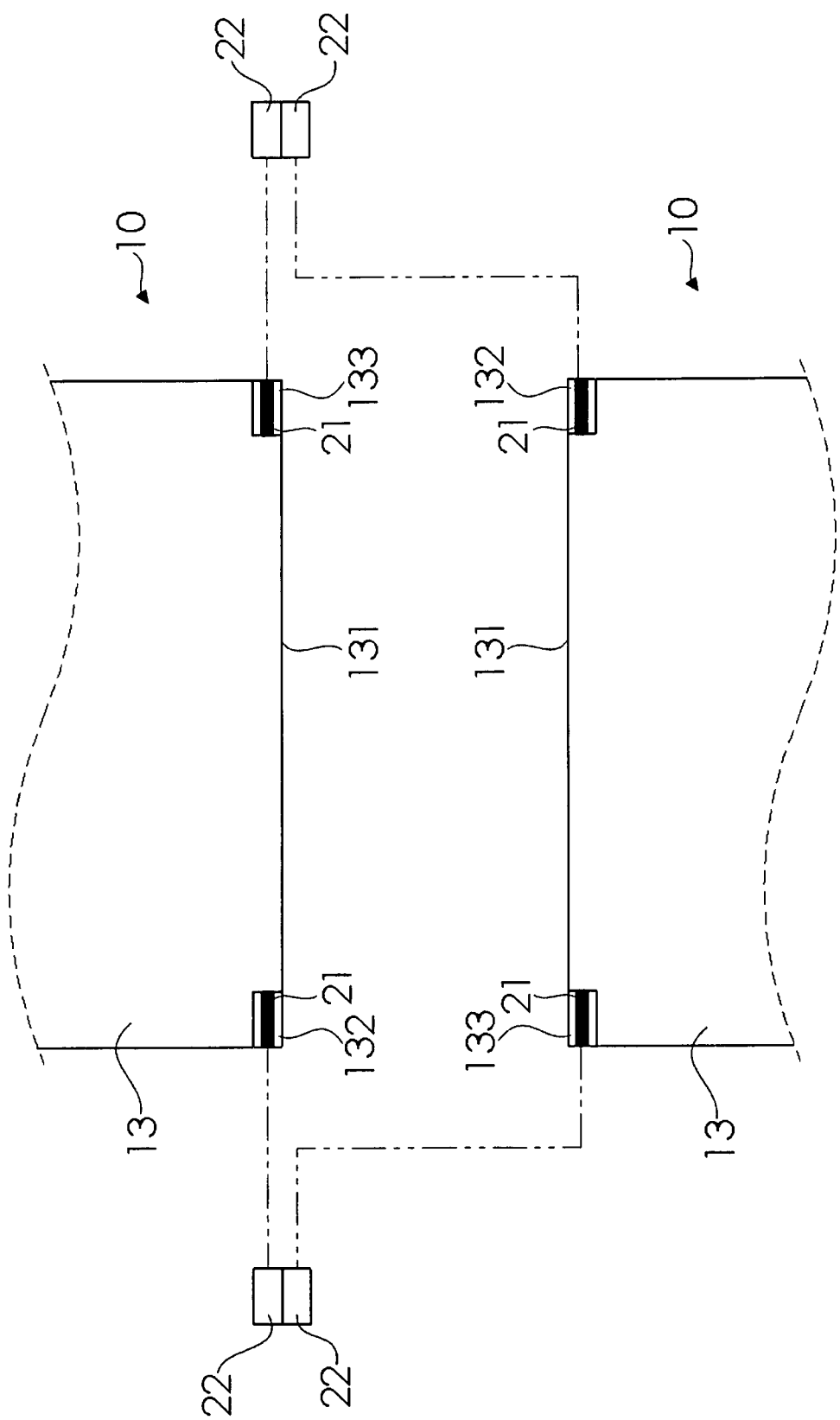

FIG. 7a is the first top view of the first embodiment for the present invention of a cascade data storage device.

Figure 7B:
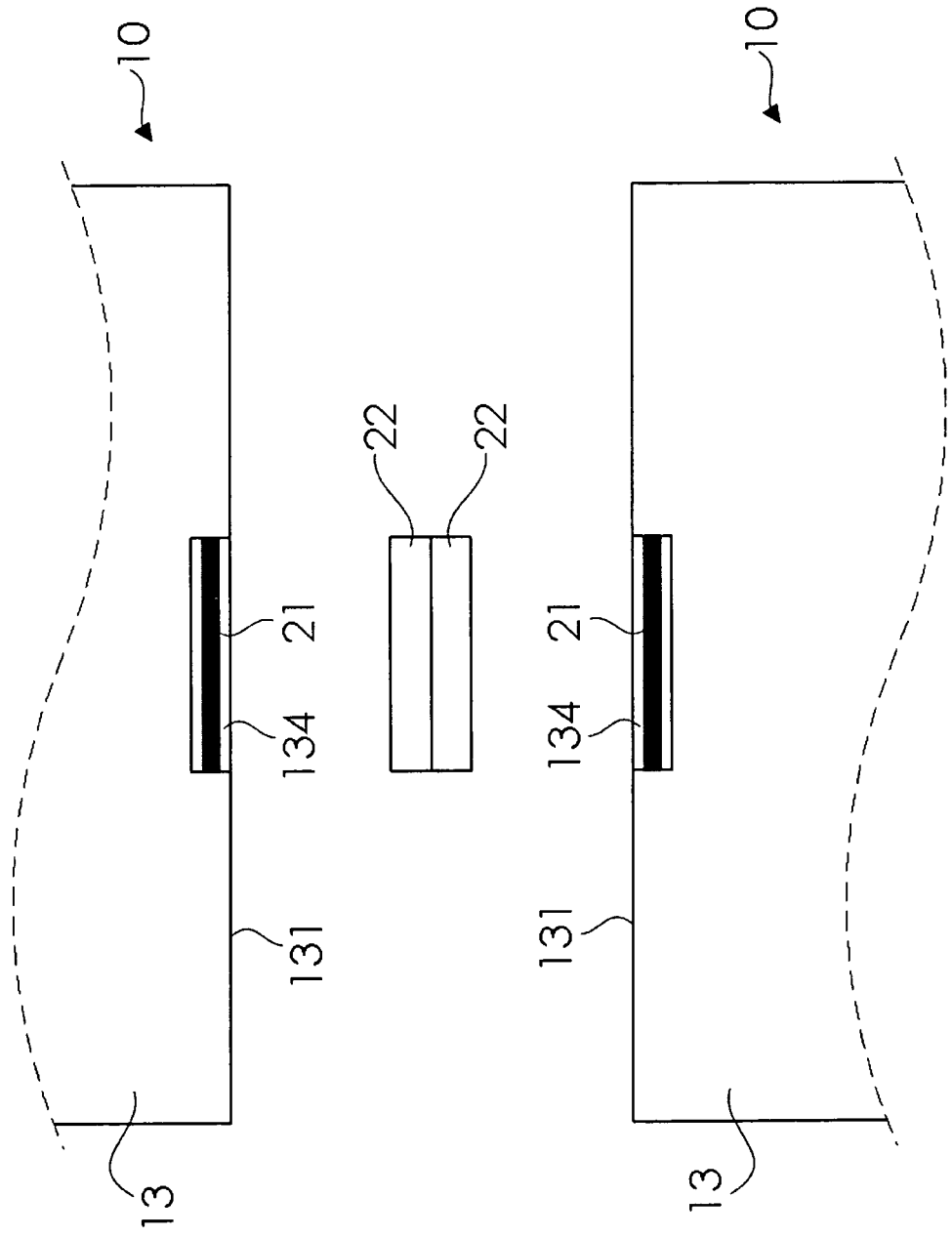

FIG. 7b is the second top view of the first embodiment for the present invention of a cascade data storage device.

DETAILED DESCRIPTIONS OF THE PREFERRED EMBODIMENTS

In order to ensure purposes, characteristics, and effects of the present invention substantially understood, some preferred embodiments are particularly specified as follows. FIGS. 1, 2, 3, 4 and 5 illustrate the first embodiment of the present invention of a cascade data storage device (1).

Figure 1:
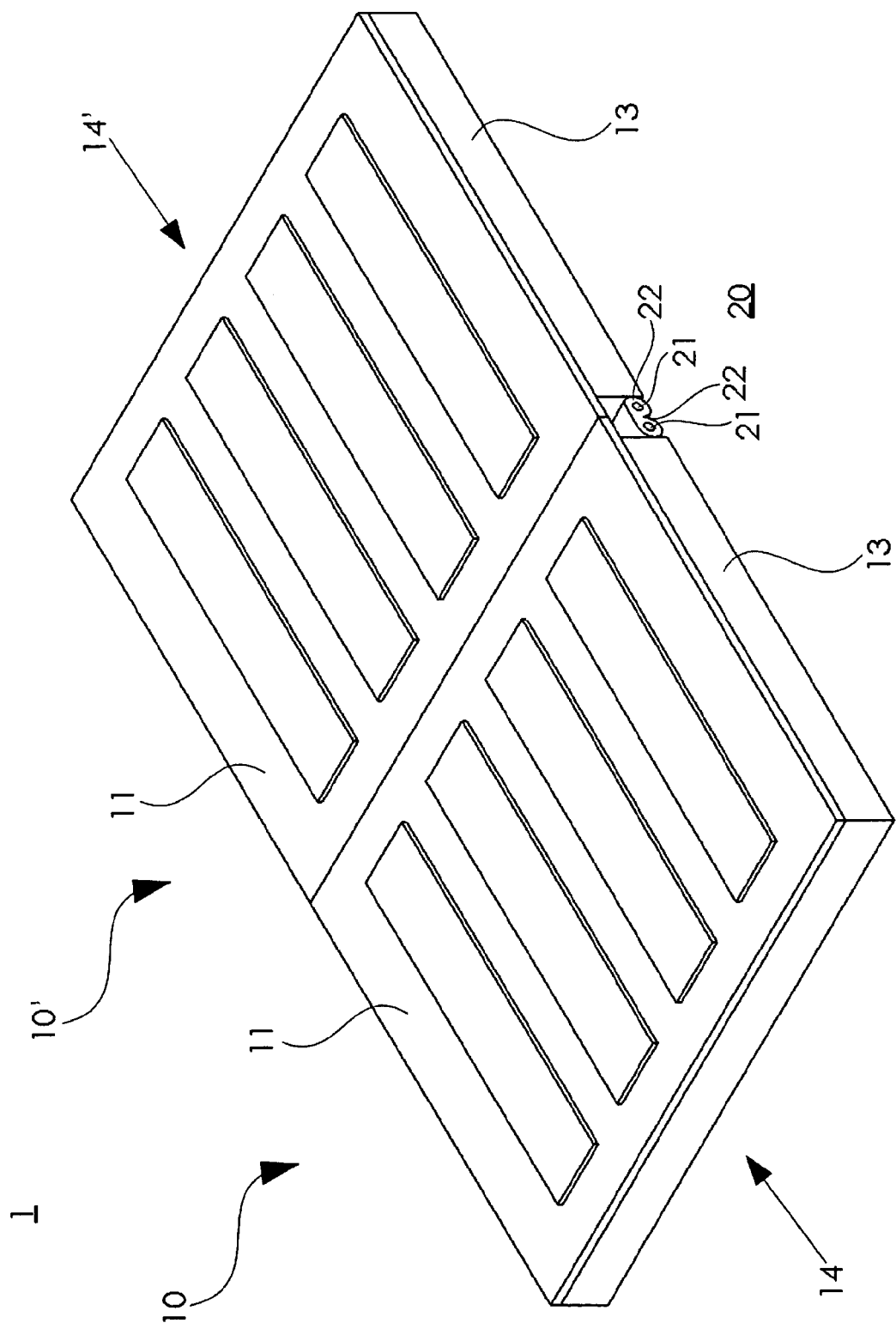
FIG. 1 is the perspective view of the first embodiment for the present invention of a cascade data storage device.
Figure 2:
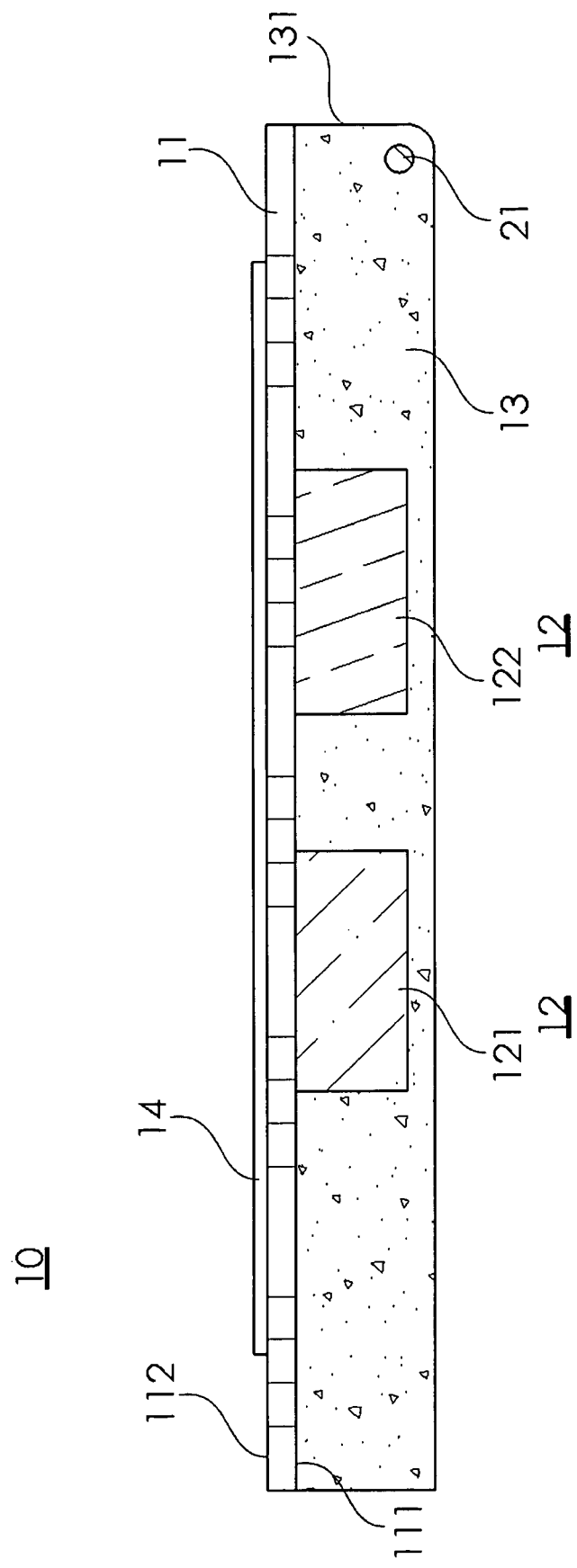
FIG. 2 is the sectional view of the first embodiment for the present invention of a cascade data storage device.

Referring to FIGS. 1 and 2 which illustrate the present invention comprising at least an integrated circuit module (10) (two integrated circuit modules (10, 10') as examples interpreted in this embodiment) and a connecting structure (20). The integrated circuit module (10) could be a Chip-On-Board (COB) package and comprises a substrate (11), at least an electronic device (12), a package body (13) and a USB metal contact (14) wherein the substrate (11) has both an inner surface (111) and an outer surface (112) which allow the electronic device (12) and the USB metal contact (14) to be installed on the inner surface (111) and the outer surface (112), respectively. Preferably, the USB metal contact (14) is compatible to data transfer interfaces such as Universal Series Bus (USB) 2.0 (or 3.0) Series A male connectors.

Specifically, the substrate (11) could be a high-density double-sided multi-layer printed circuit board with circuits (not shown in figures) developed inside as an interface for transmit of electricity and allows the USB metal contact (14) to be electrically connected to the electronic device (12) via the substrate (11). Preferably, the inner surface (111) of the substrate (11) could be developed to a package body (13) with the electronic device (12) encased. Furthermore, passive devices (not shown in figures) necessary to the cascade data storage device (1) are also installed on the inner surface (111) of the substrate (11) and encased inside the package body (13).

Figure 3:
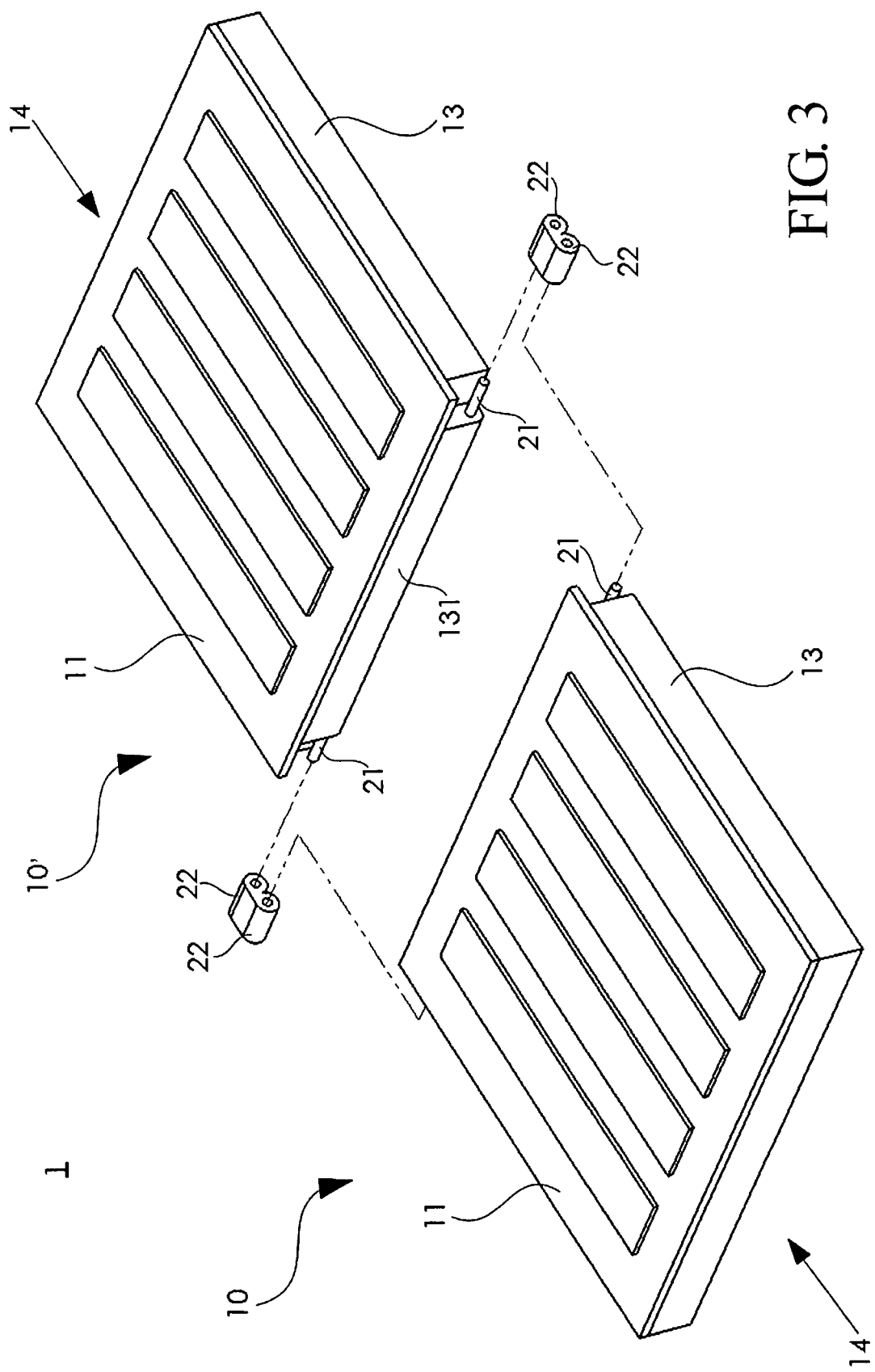
FIG. 3 is the perspective exploded view of the first embodiment for the present invention of a cascade data storage device.

Referring to FIGS. 1, 2 and 3 which illustrate the connecting structure (20) comprising at least a male connector (21) as well as at least a female connector (22) and specifically installed on a lateral edge (131) of the package body (13) delivers the male connector (21) and the female connector (22) coupled each other that indirectly facilitate two integrated circuit modules (10, 10') to be freely connected and become a cascade structure via the connecting structure (20).

Preferably, the connecting structure (20) is installed within recesses of the lateral edge (131) of the package body (13), particularly within either recesses (132, 133) at both ends of the lateral edge (131) (FIG. 7a) or a recess (134) of the lateral edge (131) (FIG. 7b) to allow both the male connector (21) and the female connector (22) of the connecting structure (20) to be accommodated inside.

In this embodiment, the male connector (21) developed as a pivot to which a pivot tube (or pivot hole) of the female connector (22) is connected will indirectly allows two integrated circuit modules (10, 10') to be freely coupled as a cascade structure; as a result of the manner to couple a male connector and a female connector being common sense in the technical field, the male connector and the female connector should not be limited to those in this embodiment but referred to as either a bulge structure freely coupled with a corresponding accommodating space (recess) (not shown in figures) or another male/female structure manufactured in other prior arts and properly applicable to the present invention.

In addition, the male connector (21) (or the female connector (22)) could be integrated with the package body (13) to become a one-piece structure; or the male connector (21) (or the female connector (22)) could be installed on the package body (13). Despite the male connector (21) (or the female connector (22)) and the package body (13) integrated as a one-piece structure which is taken as an example interpreted in this embodiment, the one-piece structure thereof should depend on a manner to couple a connecting structure and integrated circuit modules and not restrict the present invention.

Figure 4:
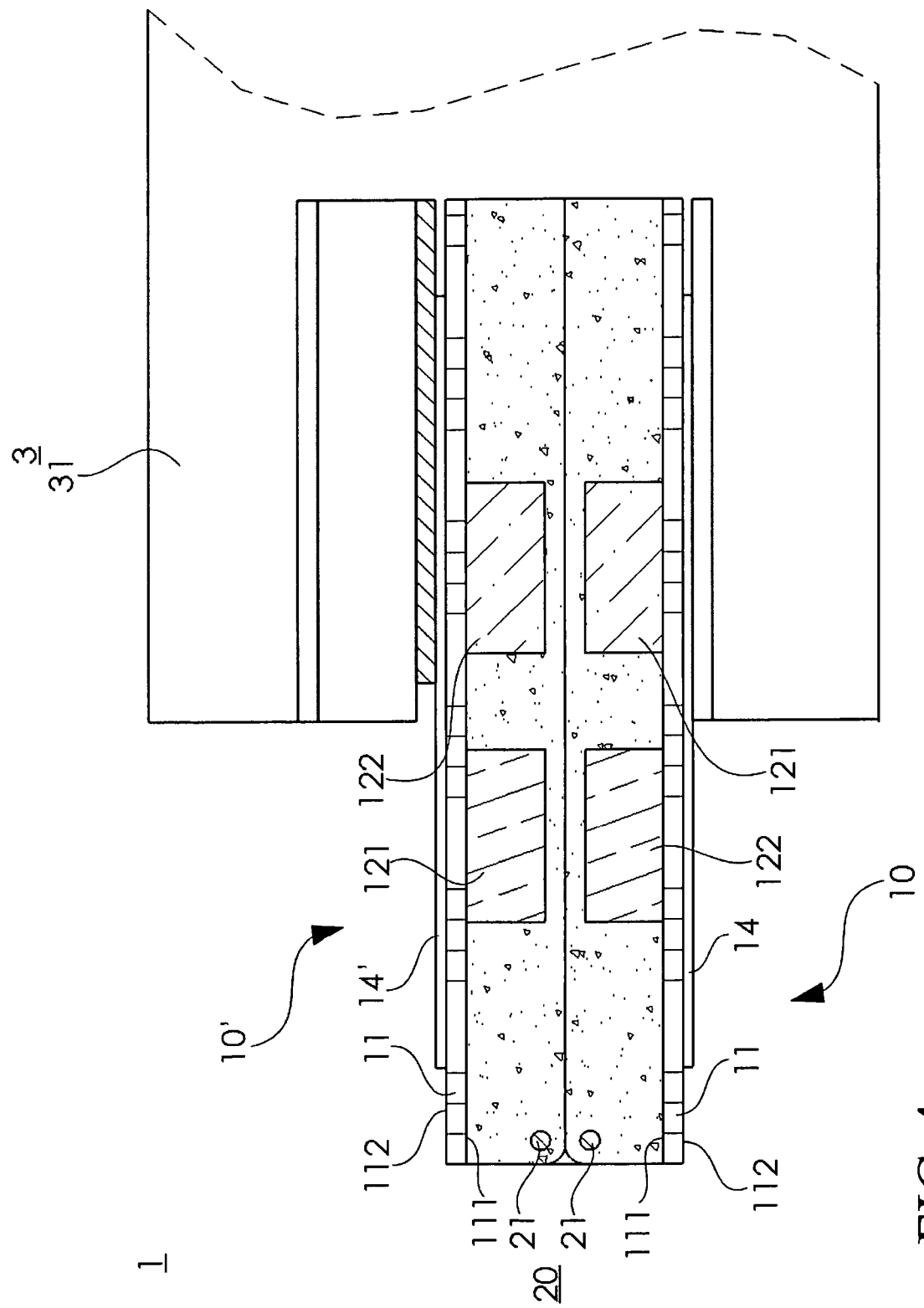
FIG. 4 is the sectional view of the first embodiment for the present invention of a cascade data storage device which is connected to a computer.

Referring to FIG. 4 which illustrates the present invention delivers the integrated circuit modules (10, 10') indirectly and freely coupled by means of the connecting structure (20) and the USB metal contact (14) of the integrated circuit module (10) (or a USB metal contact (14') of the integrated circuit module (10')) electrically connected to a USB port (31) of a computer (3) with the integrated circuit modules (10, 10') having stacked high enough. In this embodiment, the USB metal contact (14) of the integrated circuit module (10) is electrically connected to the USB port (31) of the computer (3).

In detail, the total height of the stacked integrated circuit modules (10, 10') should be equal to or less than the height of a USB Series A male connector, i.e., the total height developed by the stacked integrated circuit modules (10, 10') (FIG. 4) approximates to the height of a USB Series A male connector and keeps the USB metal contact (14) of the integrated circuit module (10) be electrically connected to the USB port (31) of the computer (3) owing to the integrated circuit modules (10, 10') compactly stacked without any gap between two modules; or the USB metal contact (14) of the integrated circuit module (10) is electrically connected to the USB port (31) of the computer (3) despite a gap (not shown in the figure) existing between the stacked integrated circuit modules. In this case of no gap between compactly stacked integrated circuit modules (10, 10'), the actual total height developed by integrated circuit modules (10, 10') should be less than the height of a USB Series A male connector.

Referring to FIGS. 1, 2, 3, 4 and 5 which illustrate the electronic device (12) comprising at least a memory unit (121) and a control unit (122). The electronic device (12)

could be electrically connected to the inner surface (111) of the substrate (11) by means of a wire bonding or a flip chip technique (not shown in figures).

Preferably, referring to FIGS. 5a and 5b which illustrate the control unit (122) comprising a virtual device module (1221) which issues a request of connecting a virtual device (FIG. 5a) to the computer (3), or comprising a human interface device module (1222) which issues a request of connecting a keyboard (FIG. 5b) to the computer (3). Furthermore, the control unit (122) electrically connected between the memory unit (121) and the USB metal contact (14) is used to determine commands as well as imported and exported control data.

In this embodiment, referring to FIG. 5a which illustrates the virtual device module (1221) in the control unit (122) of the integrated circuit module (10) issues a request of connecting a virtual device (a virtual CD-ROM in this embodiment or any virtual device such as floppy disk and floppy) to the computer (3) and the computer (3) automatically read an automatic executive program (124) saved in the memory unit (121) when the control unit (122) of the integrated circuit module (10) has a virtual device module (1221) and the USB metal contact (14) is electrically connected to the USB port (31) of the computer (3); in this regard, the automatic executive program (124), including without limitation multiple application programs for vehicle digital key, private digital data, automatic homepage guidance, automatic log-in, anti-burglar, etc., and the integrated circuit module (10) therefore, including without limitation any one of these functions hereinbefore and a combination of these functions hereinbefore.

On the other hand, referring to FIG. 5b which illustrates the human interface device module (1222) of the control unit (122') issues a request of connecting a keyboard to the computer (3) and then the control unit (122) reads an input data (123) saved in the memory unit (121) when the control unit (122) of the integrated circuit module (10) has a human interface device module (1222) and the USB metal contact (14) is electrically connected to the USB port (31) of the computer (3); in this regard, the input data (123), including without limitation multiple keyboard-related messages for vehicle digital key, private digital data, automatic homepage guidance, automatic log-in, anti-burglar, etc., and the integrated circuit module (10) therefore, including without limitation any one of these functions hereinbefore and a combination of these functions hereinbefore. Then, the integrated circuit module (10) should include but is not limited to any one of these functions hereinbefore and a combination of these functions hereinbefore according to requirements of one product.

With the said descriptions summarized, the present invention designed to configure various functions in distinct integrated circuit modules is developed as a cascade structure which is conformable to a user's requirements for multiple purposes by USB data storage devices. Accordingly, the present invention featuring characteristics such as well storage, less space occupied, user's less loss or forgetting to carry, no mistaken mix-up between integrated circuit modules and multiple functions integrated is very convenient for one user.

Referring to FIG. 6 which illustrates the second embodiment of the present invention wherein the structural characteristics explained in and identical to those shown in FIGS. 1, 2, 3, 4 and 5 are indicated with the same symbols and not repeatedly described herein.

The difference of the second embodiment from the first one is to employ a ring structure comprising a plurality of integrated circuit modules (10, 10', 10'', 10''') to illustrate the second embodiment which has some technical characteristics identical to those of the first embodiment and not repeatedly described herein.

The purpose of statements in the first and second embodiments of the present invention is to provide the preferred embodiments of the present invention in which the number of integrated circuit modules shall not be restricted and any change or modification with respect to embodiments thereof made by any person who familiarizes with the arts within the principles of the present invention, specifications or drawings shall belong to the technical field protected by the present invention.

The present invention is to cascade integrated circuit modules by means of a connecting structure and configure different functions in distinct integrated circuit modules for delivering a cascade (ring) structure in the present invention which satisfies various purposes of a USB data storage device held by one user. Therefore, the present invention featuring characteristics such as well storage, less space occupied, user's less loss or forgetting to carry, no mistaken mix-up between integrated circuit modules and multiple functions integrated is very convenient for one user.

Accordingly, the present invention with effects different from general conventional data storage devices and referred to as creative work among similar products meets patentability and is applied for the patent.

It must be reiterated that the said descriptions are the preferred embodiments of the present invention only, and any equivalent change in specifications, claims, or drawings of the present invention still belongs to the technical field protected by the present invention with reference to claims hereinafter.

What is claimed is:

1. A cascade data storage device, comprising:
   at least an integrated circuit module wherein the integrated circuit module comprises:
   a substrate, at least an electronic device, a package body and a USB metal contact wherein the substrate has an inner surface and an outer surface, the electronic device is installed on the inner surface and electrically connected to the USB metal contact of the outer surface; in addition, the package body is used to encase the electronic device;
   a connecting structure with at least a male connector and at least a female connector that indirectly facilitate two integrated circuit modules to be freely connected and become a cascade structure via the connecting structure;
   wherein the connecting structure installed on a lateral edge of the package body allows the male connector to couple with the female connector and then the integrated circuit modules freely connected, which are stacked high enough and keep the USB metal contact electrically contact with a USB port of a computer or a USB metal contact of the integrated circuit module electrically connected to a USB port of a computer with the integrated circuit modules having stacked high enough.

2. The cascade data storage device according to claim 1 wherein the electronic device comprises at least a memory unit and a control unit.

3. The cascade data storage device according to claim 1 wherein the USB metal contact is conformable to specifications of either at least one data transfer interface between USB 2.0 Series A male connectors and USB 3.0 Series A male connectors or a combination of these two interfaces hereinabove.

4. The cascade data storage device according to claim 1 wherein the integrated circuit modules stacked high enough have the height being equal to or less than the height of a USB male connector.

5. The cascade data storage device according to claim 1 wherein the male connector or the female connector could be installed on the package body.

6. The cascade data storage device according to claim 1 wherein either the male connector or the female connector could be integrated with the package body to become a one-piece structure.

7. The cascade data storage device according to claim 1 wherein the male connector with the female connector coupled allows the integrated circuit modules to become a cascade structure or a ring structure.

8. The cascade data storage device according to claim 1 wherein the connecting structure is installed inside two recesses at both ends of the lateral edge of the package body.

9. The cascade data storage device according to claim 1 wherein the connecting structure is installed inside a recess on the lateral edge of the package body.

* * * * *